United States Patent
Kim et al.

(10) Patent No.: US 6,748,032 B1
(45) Date of Patent: Jun. 8, 2004

(54) APPARATUS AND METHOD FOR ADAPTIVE MAP CHANNEL DECODING IN RADIO TELECOMMUNICATION SYSTEM

(75) Inventors: Beong-Jo Kim, Songnam-shi (KR); Min-Goo Kim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 678 days.

(21) Appl. No.: 09/584,050

(22) Filed: May 30, 2000

(30) Foreign Application Priority Data

May 28, 1999 (KR) .............................. 99-19476

(51) Int. Cl.[7] .......................... H04L 27/06; H04L 1/100
(52) U.S. Cl. ....................................... 375/340
(58) Field of Search ................. 375/142, 262, 375/341; 714/786

(56) References Cited

U.S. PATENT DOCUMENTS

| 5,619,537 A | 4/1997 | Altes |
| 5,838,738 A | 11/1998 | Zook |
| 6,061,387 A | * 5/2000 | Yi ............................... 375/142 |
| 6,119,264 A | * 9/2000 | Berrou et al. ................ 714/786 |
| 6,272,183 B1 | * 8/2001 | Berens et al. ............... 375/262 |

FOREIGN PATENT DOCUMENTS

| WO | WO 99/11009 | 3/1999 | | |
| WO | WO 99/11011 | 3/1999 | | |
| WO | WO 99/11009 | * 4/1999 | ............. | H04L/1/00 |
| WO | WO 99/11011 | * 4/1999 | ............. | H04L/1/18 |

OTHER PUBLICATIONS

Canadian Office Action dated Jul. 15, 2003 issued in a counterpart application, namely, Appln. No. 2,338,064.
Japanese Office Action dated Dec. 10, 2002, issued in a counterpart application, namely Appln. No. 2001–500571.

* cited by examiner

Primary Examiner—Stephen Chin
Assistant Examiner—Lawrence Williams
(74) Attorney, Agent, or Firm—Dilworth & Barrese LLP

(57) ABSTRACT

An adaptive MAP channel decoding apparatus and method in a mobile communication system. In the adaptive MAP channel decoding apparatus, a channel estimator calculates channel noise power and a scaling factor, a controller determines an operation mode by checking accumulated channel noise power and the scaling factor, and a MAP channel decoder performs a MAP decoding operation with an E function including a log function in a static channel mode and an E function free of a log function in a time-varying channel mode.

12 Claims, 6 Drawing Sheets

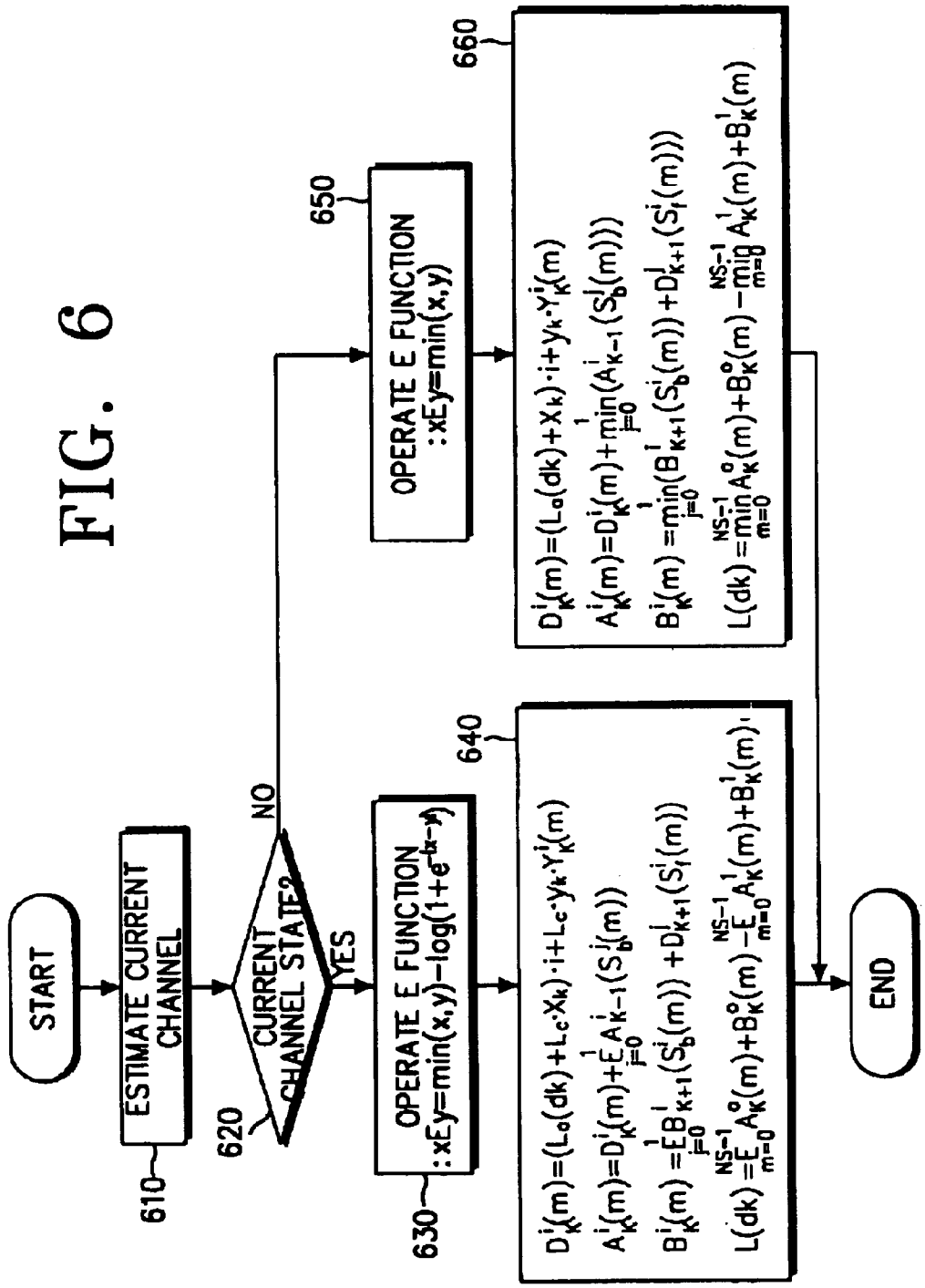

APPARATUS AND METHOD FOR ADAPTIVE MAP CHANNEL DECODING IN RADIO TELECOMMUNICATION SYSTEM

This application claims priority to an application entitled "Apparatus and Method for Adaptive Map Channel Decoding in Radio Telecommunication System" filed in the Korean Industrial Property Office on May 28, 1999 and assigned Ser. No. 99-19476, the contents of which are hereby incorporated by reference.

BACKGROUND OF THE INVENTION

1. Field of the Invention

The present invention relates generally to a channel decoding apparatus and method in a radio telecommunication system, and in particular, to a MAP (Maximum Aposteriori Probability) channel decoding apparatus and method.

2. Description of the Related Art

Various channel codes are widely used to conduct communications reliably in a radio telecommunication system (e.g., satellite system, WCDMA, UMTS, and CDMA 2000) The present invention pertains to a turbo code decoding apparatus and method using recursive systematic convolutional codes for data transmission in a bad channel environment.

Turbo code decoding is implemented in a MAP or a SOVA (Soft Output Viterbi Algorithm) method. The former exhibits optimal performance in terms of bit error rate (BER). The performance of a MAP channel decoder is about 0.6–0.7 dB higher than that of a SOVA channel decoder in an ideal receiver. To achieve ideal operation of a receiver for MAP or SOVA turbo decoding, the following conditions must be satisfied: (1) the receiver estimates the current channel state accurately; and (2) the receiver uses a sufficient number of bits for inner operations.

Meanwhile, the receiver can also subject an input signal to RF (Radio Frequency) processing, down-conversion, ADC (analog-to-digital conversion), and symbol demodulation.

Generally, noise power estimation in a channel environment precedes a MAP operation. Therefore, a MAP channel decoder receives noise power estimated by a channel estimator and the noise power determines decoding performance.

A plurality of metrics are used as main variables in a MAP algorithm. Hereinbelow, equations required to implement the MAP algorithm will be described.

A branch metric (BM) is calculated by $$D_k^i(m) = (L_a(d_k) + L_c \cdot x_k) \cdot i + L_c \cdot y_k \cdot Y_l^i(m) \qquad (1)$$

where $L_a(d_k)$ is extrinsic information obtained from a feedback loop in a MAP channel decoder, $L_c$ is channel reliability which can be expressed as $2/\sigma^2$ ($\sigma^2$ is noise power estimated by a channel estimator), $x_k$ is a systematic code, $y_k$ is a parity code, i is an expected systematic code, and $Y_l^i(m)$ is an expected parity code.

A forward state metric (FSM), Alpha is $$A_k^i(m) = D_k^i(m) + E^1_{j=0}(A_{k-1}^i(S_b^i(m))) \qquad (2)$$

where $S_b^j(m)$ indicates a backward changed state when an information bit is j to set a current state to m. The E function is defined as $$xEy = \min(x, y) - \log(1 + e^{-|x-y|}) \qquad (3)$$

In a MAP algorithm, x and y can be metric values such as Beta and Alpha as can be seen in (4) and (2)

A reverse state metric (RSM), Beta is $$B_k^i(m) = E^1_{j=0}(B^i_{k+1}(S_b^i(m)) + D^j_{k+1}(S_f^j(m))) \qquad (4)$$

where $S_f^j(m)$ is a state changed forward when an information bit is input in a current encode state m.

If an information bit is $d_k$ at time k of MAP, a log likelihood ratio (LLR) is $$L(d_k) = E^{NS-1}_{m=0} A_k^0(m) + B_k^0(m) - E^{NS-1}_{m=0} A_k^1(m) + B_k^1(m) \qquad (5)$$

where $L(d_k)$ is an LLR when an information bit is $d_k$ at time k of MAP and $E^{NS-1}_{m=0}$ indicates that an operation is performed on NS E functions.

The MAP decoder calculates a BM from a received code and then an RSM in the above equations, as stated above. The MAP decoder calculates an LLR being a decoded soft output simultaneously with calculation of an FSM.

As noted from Eq. 1, the MAP channel decoder needs $L_c$ to calculate the BM. That is, the MAP channel decoder can calculate the BM only after it finds out the noise power of a channel environment. According to a general MAP algorithm, therefore, the decoding performance of the MAP channel decoder is sensitively influenced by the operation of a channel estimator.

If a channel decoder is implemented for turbo decoding, it is preferred that the channel decoder operates stably in a real mobile communication channel environment regardless of the current channel state.

Particularly, an input signal is multiplied by a scaling factor according to changes in the channel status, like fading, and it is not easy for a receiver to obtain an accurate scaling factor with respect to the current channel state. However, an accurate scaling factor must be reflected to obtain accurate estimation of the channel state. That is, when the channel reliability $L_c$ is degraded, the decoding performance of a MAP algorithm is also degraded, unless the scaling factor is accurately calculated.

The receiver quantizes an input analog signal with limited bits. As a result, an input signal with strength greater than a predetermined level is clipped. The dynamic range of this input signal seriously influences the performance of the channel decoder, especially in power control.

SUMMARY OF THE INVENTION

It is, therefore, an object of the present invention to provide a stable MAP channel decoding apparatus and method in the preset mobile communication channel environment.

It is another object of the present invention to provide an apparatus and method for decoding data stably in a real channel environment of a mobile communication system.

It is a further object of the present invention to provide a MAP channel decoding apparatus and method in which decoding is stably performed regardless of channel noise power in a channel environment of a mobile communication system.

It is still another object of the present invention to provide a stable MAP channel decoding apparatus and method in which a MAP channel decoding is performed with a first E function including a log function if the current channel state is a static channel state and with a second E function free of a log function if the current channel state is a time-varying channel state to ensure optimal decoding performance in a real mobile communication channel environment.

Briefly, these and other objects can be achieved by providing an adaptive MAP channel decoding apparatus and method in a mobile communication system. In the adaptive MAP channel decoding apparatus, a channel estimator calculates channel noise power and a scaling factor, a controller determines an operation mode by checking accumulated channel noise power and the scaling factor, and a MAP channel decoder performs a MAP decoding operation with an E function including a log function in a static channel mode(good channel status) and an E function free of a log function in a time-varying channel mode.(bad channel status).

In the adaptive MAP channel decoding method according to another aspect of the present invention, a current channel state is first estimated. Then, an E function including a log function is performed if the current channel state is static and an E function free of a log function is performed if the current channel state is time-varying.

BRIEF DESCRIPTION OF THE DRAWINGS

The above and other objects, features and advantages of the present invention will become more apparent from the following detailed description when taken in conjunction with the accompanying drawings in which:

FIG. 6 is a flowchart illustrating a MAP decoding method adaptive to a current channel state according to the embodiment of the present invention.

DETAILED DESCRIPTION OF THE PREFERRED EMBODIMENT

A preferred embodiment of the present invention will be described hereinbelow with reference to the accompanying drawings. In the following description, well-known functions or constructions are not described in detail to avoid obscuring the invention in unnecessary detail.

The present invention provides a MAP channel decoding apparatus and method in which MAP channel decoding is stably implemented regardless of the noise power of a channel in a real mobile communication channel environment when a channel decoder is implemented using a MAP algorithm, which is one of the main algorithms for turbo decoding.

In the present invention, a general MAP algorithm is implemented in a static channel state and a sub-MAP algorithm is implemented using two E functions, presented according to the present invention in a time-varying channel state, for stable MAP channel decoding.

To calculate a BM without $L_c$ in Eq. 1, an E function should be amended in Eq. 3. The E function is defined as the difference between a min function and a log function. The log function shows nonlinear characteristics. Therefore, the present invention defines a new E function (referred to as 2E function hereinafter) obtained by removing the log function from the E function as follows.

$$xEy = \min(x, y) \qquad (6)$$

The reason for omitting $\log(1+e^{-|x-y|})$ in Eq. 6 can be found by evaluating Eq. 7.

$$F(z) = \log(1+e^{-|z|}) \qquad (7)$$

Figure 1:
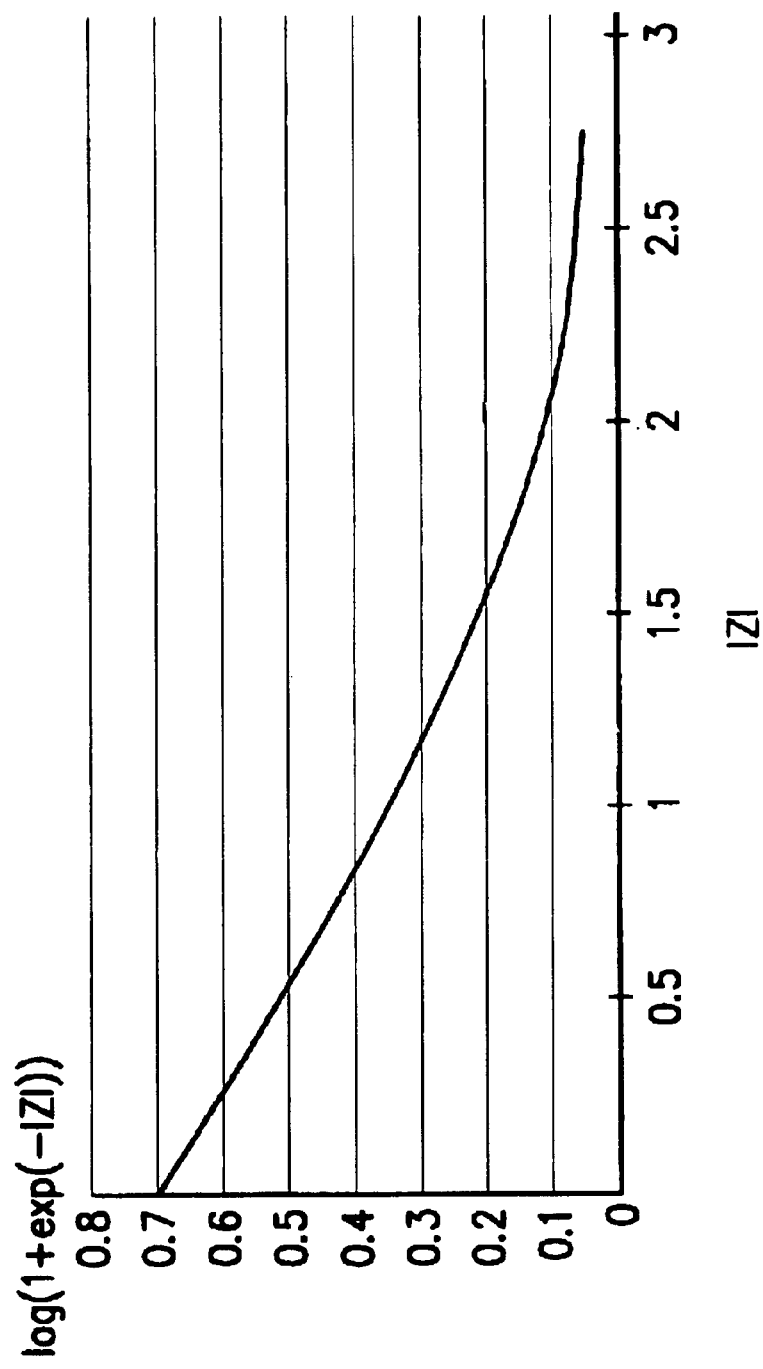
FIG. 1 is a graph illustrating the significance of a new E function according to an embodiment of the present invention.

Eq. 7 is symmetrical and as $|z|$ increases, F(z) rapidly converges to 0 as illustrated in FIG. 1. FIG. 1 is a graph illustrating the significance of the log function from the new 2E function according to the embodiment of the present invention. The horizontal axis in the graph indicates $|z|$ and the vertical axis, F(z) of Eq. 7. As shown in the graph, F(z) is rapidly converged to 0 as $|z|$ increases.

It can be noted from FIG. 1 that as $|x-y|$ of Eq. 3 increases, $\log(1+e^{-|x-y|})$ is converged to 0, having no influence on the E function. Accordingly, it can be expected that $\log(1+e^{-|x-y|})$ does not influence the E function unless the difference between x and y is small, that is, a SNR is very small. That is, a change in the performance of a real MAP algorithm without $\log(1+e^{-|x-y|})$ in the conventional E function is negligible only if a certain SNR is maintained for a channel environment.

Figure 2:
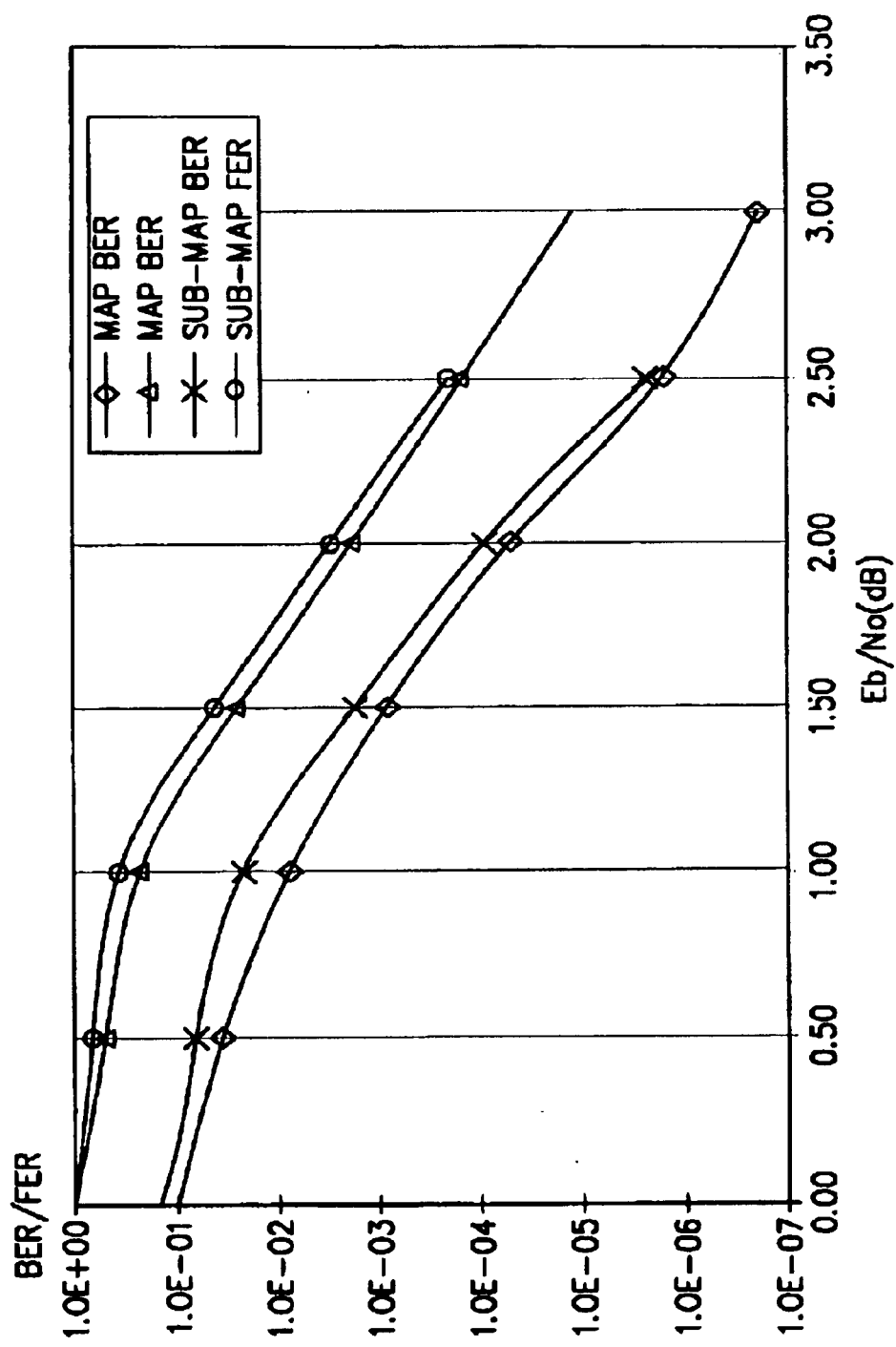
FIG. 2 is a graph illustrating performance comparisons between a real implemented MAP turbo decoder, sub-MAP turbo decoder, a simulated MAP turbo decoder and sub-MAP turbo decoder.

FIG. 2 is a graph illustrating performance comparisons between a MAP channel decoder and a sub-MAP channel decoder when they are implemented and simulated. The vertical axis represent a BER (bit error rate) and FER (frame error rate) and the horizontal axis represent $E_b/N_o$. Each component decoder has a constraint length k=4, a code rate r=½, and a frame length of 375 bits. A test was performed on an AWGN (Additive White Gaussian Noise) channel in an ideal channel estimation state.

As shown in FIG. 2, the gain performance of the sub-MAP algorithm is less than that of the MAP algorithm by about 0.1 dB. However, if an SNR is 2.5 dB, there is little difference in performance between the MAP channel decoder and the sub-MAP channel decoder. According to the test result, if a channel environment ensures an SNR of a predetermined level, $\log(1+e^{-z|x-y|})$ in Eq. 3 converges to approximately near 0.

Meanwhile, according to the definition of the new E function as Eq. 6, Eqs. 1, 2, 4, and 5 can be changed respectively to $$\begin{aligned} D_k^i(m) &= (L_a(d_k) + L_c \cdot x_k) \cdot i + L_c \cdot y_k \cdot Y_1^i(m) \\ A_k^i(m) &= D_k^i(m) + \min_{j=0}^{1} (A_{k-1}^j(S_b^j(m))) \\ B_k^i(m) &= \min_{j=0}^{1} (B_{k+1}^j(S_b^i(m)) + D_{k+1}^j(S_f^j(m))) \\ L(d_k) &= \min_{m=0}^{NS-1} A_k^0(m) + B_k^0(m) - \min_{m=0}^{NS-1} A_k^1(m) + B_k^1(m) \end{aligned} \qquad (8)$$

where $L_c$ is offset. Since extrinsic information $L_a$ obtained from a recursive decoder feed-back loop starts from 0 and thus initial FSM and RSM do not involve $L_c$ multiplication. Therefore, Eq. 8 can be changed to $$D_k^i(m) = (L_a(d_k) + x_k) \cdot i + y_k \cdot Y_1^i(m)$$

$$A_k^i(m) = D_k^i(m) + \min_{j=0}^{1}(A_{k-1}^i(S_b^j(m)))$$

$$B_k^i(m) = \min_{j=0}^{1}(B_{k+1}^i(S_b^i(m)) + D_{k+1}^j(S_f^j(m)))$$

$$L(d_k) = \min_{m=0}^{NS-1} A_k^0(m) + B_k^0(m) - \min_{m=0}^{NS-1} A_k^1(m) + B_k^1(m)$$

(9)

where $L_c$ is not used in the sub-MAP algorithm according to the embodiment of the present invention as the new E function is defined as Eq. 6. That is, the sub-MAP algorithm is independent of channel noise power.

Now, the sensitivity of the decoding performances of the MAP algorithm and the sub-MAP algorithm when real channel noise power is mismatched will be discussed. Fixed point simulation is assumed herein for the MAP channel decoder and the sub-MAP channel decoder. That is, a predetermined number of quantization bits are used for an internal metric in a component decoder.

As a simulation condition, an input signal on an AWGN is scaled as $$S = (c + \sigma \cdot n) \cdot g \qquad (10)$$

where S is an input signal, $c \in \{+1, -1\}$ is a code symbol, n is a sample value of normal distribution N(0, 1), g is a scaling factor, and $\sigma$ is the standard deviation of channel noise. Thus, $\sigma^2$ is the channel noise power.

In Eq. 10, $c \cdot g$ is the signal component and $\sigma \cdot n \cdot g$ is the noise component. When, the scaling factor g is removed, the SNR of the input signal S will be a constant value SNR= $(c \cdot g)/(\sigma \cdot n \cdot g) = c/(\sigma \cdot n)$, regardless of g. That is, the scaling in Eq. 10 is based on the assumption that the variation of a channel state is equal to the resulting change in a transmission signal. Therefore, the simulation condition of Eq. 10 maintains the SNR constant via the scaling factor g. To satisfy the above condition, the level of the input signal is artificially increased or decreased. As a result, the input signal deviates from the dynamic range of a quantizer having limited quantization levels and a limited quantization range.

The sensitivity of the decoding performance of the MAP algorithm and the sub-MAP algorithm will be described in the context of the above simulation condition. Unless $L_c$ as related with scaling is accurately reflected in the MAP algorithm, the decoding performance of the MAP channel decoder will rapidly drop relative to the sub-MAP decoder. If the MAP channel decoder operates within the simulation condition, a component decoder must multiply an input signal by $L_c = 2/(g \cdot \sigma)^2$ where an accurate scaling factor is reflected but receives $L_c = 2/\sigma^2$ instead. Consequently, the decoding performance of the MAP channel decoder is decreased.

On the other hand, the sub-MAP channel decoder operates regardless of $L_c$, the decrease in performance when an input signal level deviates from a dynamic range is attributed to the relative change of a quantization range and resolution due to a scaling factor.

Figure 3:
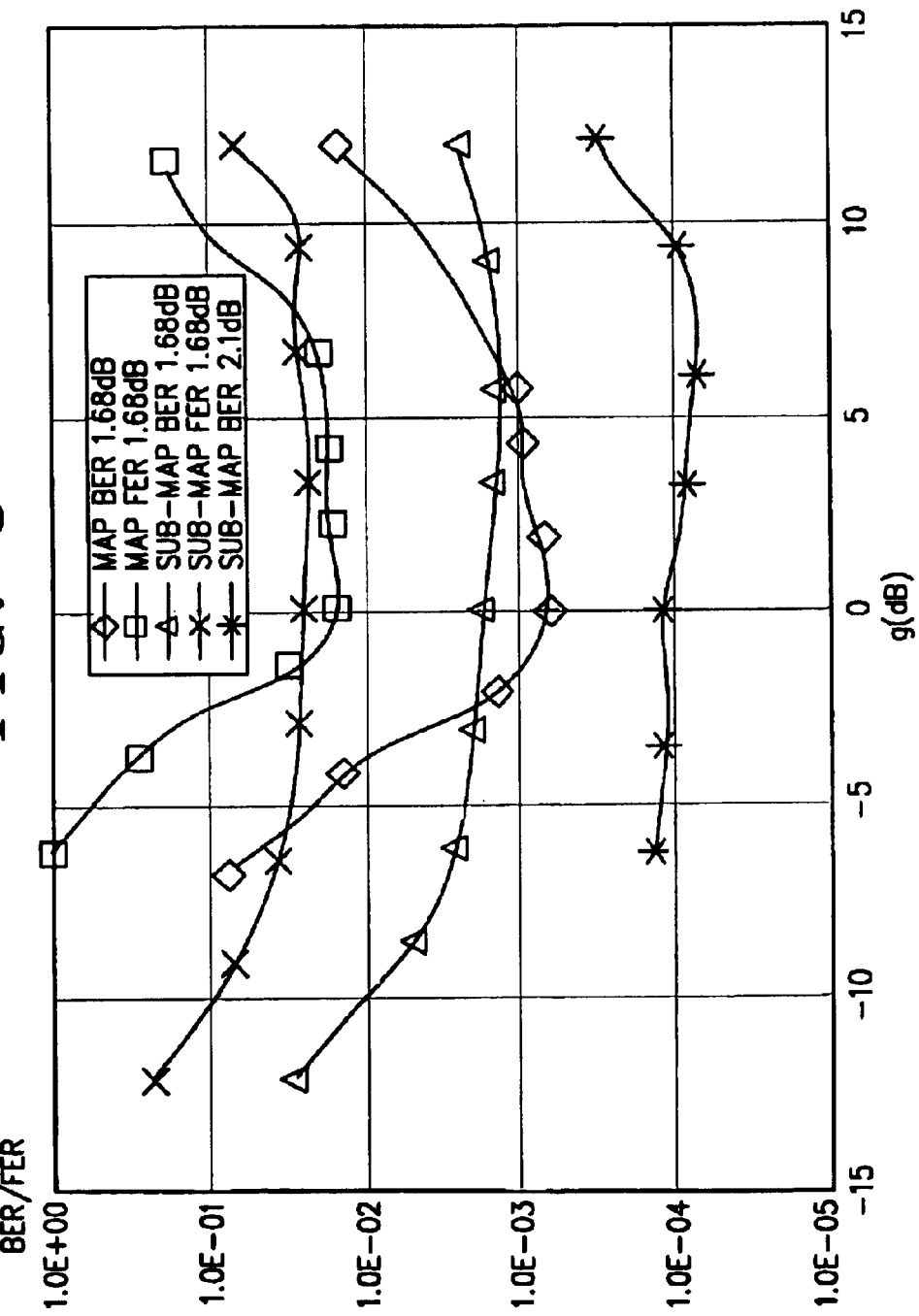
FIG. 3 is a graph illustrating performance comparisons between a real sub-MAP turbo decoder and a real MAP turbo decoder at various scaling factors at a corresponding $E_b/N_o$ according to the embodiment of the present invention.

FIG. 3 is a graph illustrating performance comparisons between a real MAP channel decoder and a real sub-MAP channel decoder when a scaling factor in $E_b/N_o$ is changed according to the embodiment of the present invention. The vertical axis in the graph denotes the BER and FER and the horizontal axis, the value of factor g, is expressed in dB. If the horizontal axis is set to 20×log(g) and g is 3, 20×log(3) will be shown as g in the graph. For g=1, log1=0. Therefore, g is 0 on the graph.

It can be noted from FIG. 3 that the MAP channel decoder is superior to the sub-MAP channel decoder in terms of decoding performance as long as an accurate g is obtained. However, as the scaling factor g is gradually increased or decreased, the decoding performance of the MAP channel decoder rapidly decreases. This implies that the decoding performance of the MAP channel decoder is very sensitive to a current channel state.

On the other hand, the sub-MAP channel decoder exhibits a slow change in decoding performance with respect to the change of the scaling factor g. That is, the sub-MAP decoding has a wider operation range with respect to the change of the scaling factor g than the MAP decoding. Accordingly, the sub-MAP decoding scheme according to the embodiment of the present invention is more stable with less influence from the current channel state in a real mobile radio environment, as compared to the MAP decoding scheme.

As shown in FIG. 3, the sub-MAP channel decoder has a stable operation range from about −10 dB to +10 dB, whereas the MAP channel decoder has a stable operation range from about −3 dB to +6 dB.

Depending on the SNRs, MAP channel decoders differ in performance from the sub-MAP channel decoder, as noted from FIGS. 2 and 3. But they are equal at an SNR over a specific level. In this case, the decrease of performance caused by channel noise power mismatch cannot be found in a range from +10 to −10 dB.

Figure 4:
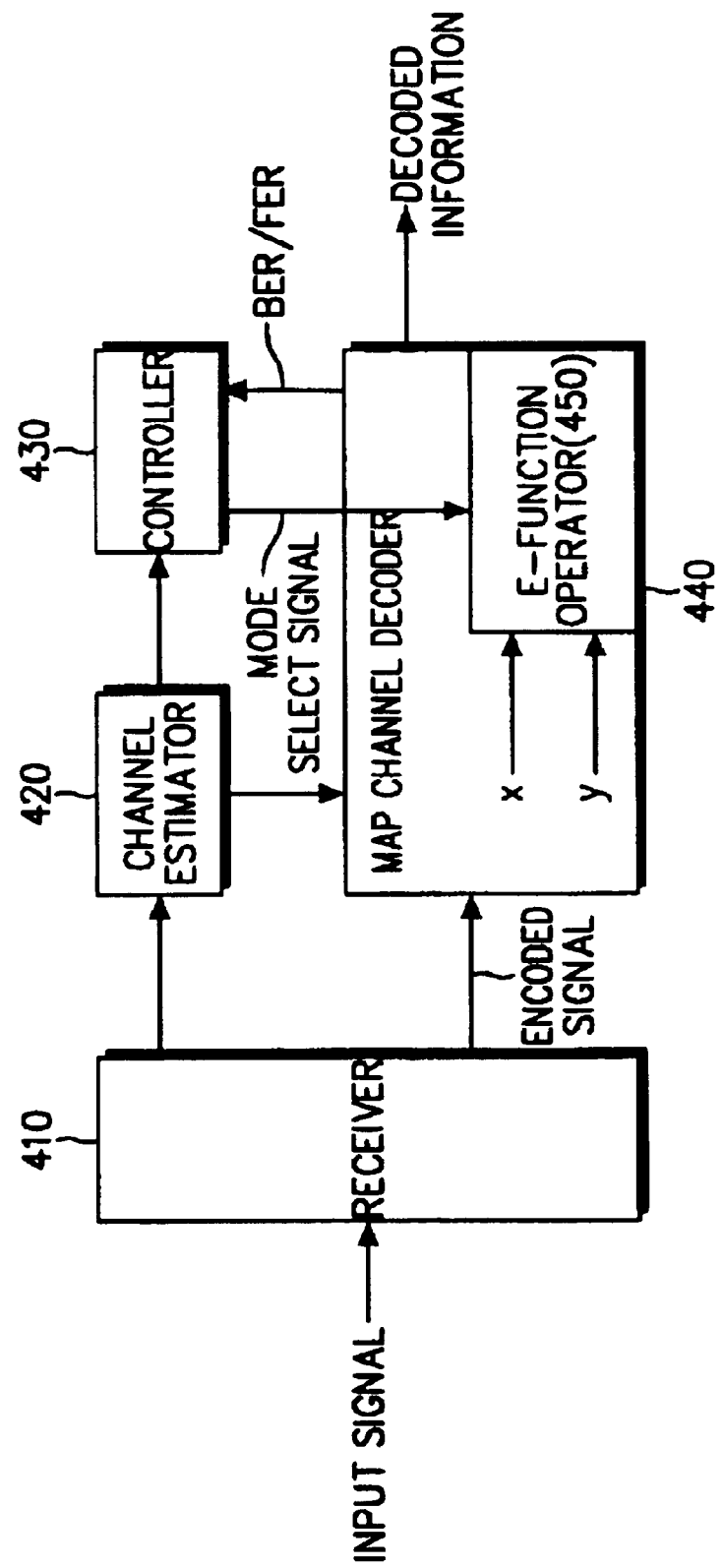
FIG. 4 is a block diagram illustrating an adaptive MAP recursive decoding apparatus depending on a channel state according to the embodiment of the present invention.

FIG. 4 is a block diagram illustrating a MAP channel decoding apparatus adaptive to a channel state according to the embodiment of the present invention. Referring to FIG. 4, a receiver 410 subjects an analog radio signal received through an antenna (not shown) to RF processing, down-converts the RF signal to an IF signal, analog to digital converts the IF signal, symbol demodulates and outputs the demodulated signal. A channel estimator 420 calculates a channel noise power and a scaling factor from the output of the receiver 410. A controller 430 determines the operation mode of a MAP channel decoder between a static channel mode and a time-varying mode according to the output of the channel estimator 420. The determination is made based on changes in channel noise power and the scaling factor. The controller 430 can determine the operation mode based on BER/FER received from the MAP channel decoder 440. For example, if a predetermined number of successive occurrences of a scaling factor approximate to a predetermined dB are observed, the controller 430 determines the operation mode to be a static channel mode.

Meanwhile, if the controller 430 determines that the current channel state is a static channel mode, an E function operator 450 of the MAP channel decoder 440 processes inputs x and y in Eq. 3 for optimal decoding performance. The MAP channel decoder 440 decodes the input signal using Eqs. 1, 2, 4, and 5. In the time-varying channel mode, the E function operator 450 processes the inputs x and y in Eq. 6 and then the MAP channel decoder 440 decodes the input signal using Eq. 9.

A long function in the E function operator 450 can be implemented using a look-up table. The look-up table may be stored in a relatively small amount of memory because the $\log(1+e^{-|x-y|})$ function rapidly drops as. |x−y| increases, as stated in FIG. 1.

Figures 5A, 5B:
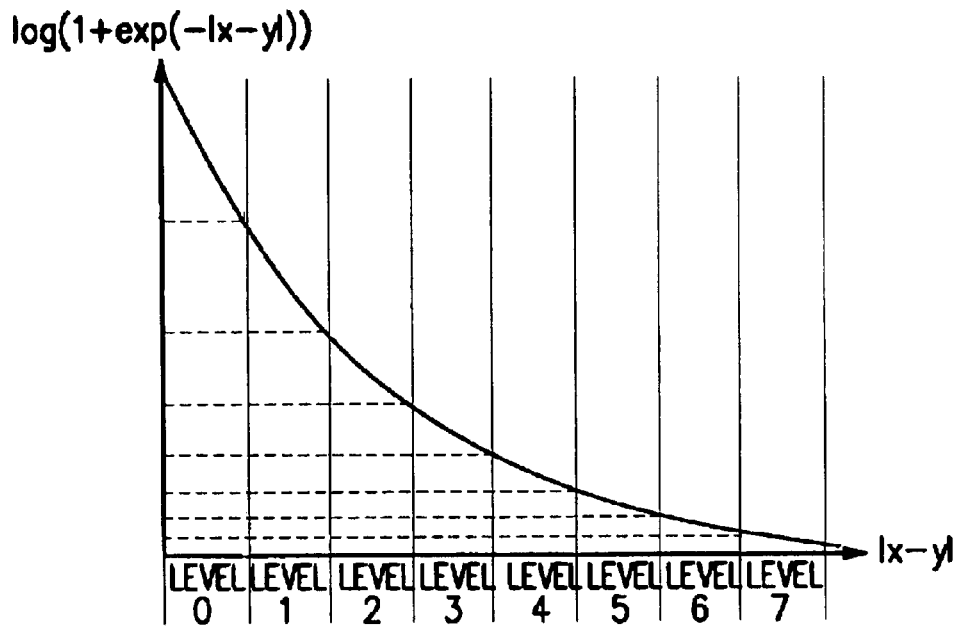
FIG. 5A is a graph illustrating a procedure of implementing a log function by referring to a look-up table according to the embodiment of the present invention.
FIG. 5B illustrates the look-up table referred to for implementing a log function according to the embodiment of the present invention.

FIG. 5A is a graph illustrating the procedure for implementing a log function by referring to a look-up table according to the embodiment of the present invention and FIG. 5B illustrates the look-up table for implementing the log function according to the embodiment of the present invention.

The horizontal axis in the graph shown in FIG. 5A represents the level of a function input value corresponding to the difference between input values x and y of the E function operator 450 and the vertical axis represents log $(1+e^{-|x-y|})$ versus the function input levels stored in the table.

The input values x and y have been quantized and there are a limited number of |x−y| values. As shown in FIG. 5B, the look-up table uses the difference between x and y as a memory address and stores an already calculated function value corresponding to the memory address in a data area.

Due to the nature of the $\log(1+e^{-|x-y|})$, an output value is inversely proportional to an input value in the look-up table according to the embodiment of the present invention. Hence, the look-up table may be stored in a relatively small amount of memory.

FIG. 6 is a flowchart illustrating a MAP decoding method adaptive to a current channel state according to the embodiment of the present invention. The adaptive MAP decoding method will be described referring to FIGS. 1 to 6.

The controller 430 estimates a current channel state through the channel estimator 420 in step 610. In step 620, the controller receives accumulated channel noise power or a scaling factor from the channel estimator 420 and determines the current channel state according to the variations in the channel noise power or the scaling factor. In addition, the controller 430 can determine the current channel state according to a change in BER/FER received from the MAP channel decoder 440.

The controller 430 outputs a mode select signal to the MAP channel decoder 440 to operate the MAP channel decoder 440 in a static channel mode in step 630. That is, the E function operator 450 of the MAP channel decoder 440 processes input x and y using Eq. 3, namely, a general E function in step 630. Thus, the MAP channel decoder 440 decodes the input signal using Eqs. 1, 2, 4, and 5, as illustrated by step 640. Here, the E function operator 450 can implement a log function referring to a look-up table.

If the controller 430 determines the current channel state to be time varying in step 620, the controller 430 outputs the mode select signal to the MAP channel decoder 440 to operate it in a time-varying channel mode in step 650. That is, the E function operator 450 performs MAP channel decoding using Eq. 9, namely, the 2E function according to the present invention, as illustrated by step 660.

As described referring to FIGS. 1 to 6, the sub-MAP channel decoding algorithm according to the present invention is independent of a current channel state, which can reduce the sensitivity of a MAP algorithm to a channel state change. In addition, the sub-MAP algorithm has increased stability in a real mobile communication channel environment as compared to the MAP algorithm.

In accordance with the adaptive MAP channel decoding apparatus and method of the present invention, a current channel state is first checked based on the change of accumulated channel noise power or a scaling factor of a channel estimator, or a change in BER/FER of a MAP channel decoder. If the current channel state is determined to be static, decoding is performed using an E function including a log function to ensure optimal decoding performance. If the current channel state is to be time-varying, the log function is not used in the E function operation regardless of the current channel state to perform stable channel decoding in a real mobile communication channel environment. Therefore, MAP channel decoding is implemented adaptively to a channel state.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An adaptive MAP channel decoding apparatus in a communication system, comprising:
   a channel estimator for calculating a channel noise power and a scaling factor;
   a controller for determining an operation mode according to the channel noise power and the scaling factor; and
   a MAP channel decoder having an E function operator for selectively operating in a static channel mode, according to the following equation:

$$xEy=\min(x, y)-\log(1+e^{-|x-y|})$$

and in a time-varying mode, according to the following equation:

$$xEy=\min(x, y)$$

where x and y are metric values.

2. The adaptive MAP channel decoding apparatus of claim 1, wherein the MAP channel decoder performs a first MAP channel decoding operation using the following equations while in the static channel mode:

$$\left.\begin{aligned}D_k^i(m) &= (L_a(d_k) + L_c \cdot x_k) \cdot i + L_c \cdot y_k \cdot Y_1^i(m) \\ A_k^i(m) &= D_k^i(m) + E_{j=0}^1(A_{k-1}^i(S_b^j(m))) \\ B_k^i(m) &= E_{j=0}^1(B_{k+1}^i(S_b^i(m)) + D_{k+1}^j(S_f^j(m))) \\ L(d_k) &= E_{m=0}^{NS-1} A_k^0(m) + B_k^0(m) - E_{m=0}^{NS-1} A_k^1(m) + B_k^1(m)\end{aligned}\right\}$$

where $D_k^i(m)$=a branch metric (BM)
   $L_a(d_k)$=extrinsic information obtained from a feed-back loop in the MAP channel decoder;
   $L_c$=channel reliability which can be expressed as $2/\sigma^2$ ($\sigma^2$ is noise power);
   $x_k$=a systematic code;
   $y_k$=a parity code;
   i=an expected systematic code;
   $Y_l^i(m)$=an expected parity code;
   $A_i^k(m)$=a forward state metric (FSM);
   $S_b^j(m)$=a backward changed state when an information bit is j to set a current state to m;
   $B_k^i(m)$=a reverse state metric (RSM);
   $S_f^j(m)$=a state changed forward when an information bit is input in a current encode state m; and
   $L(d_k)$=a log likelihood ratio (LLR) when an information bit is $d_k$ at time k of MAP; and performs a second MAP channel decoding operation using the following equations while in a time-varying mode:

$$\left.\begin{aligned}D_k^i(m) &= (L_a(d_k) + x_k) \cdot i + y_k \cdot Y_1^i(m) \\ A_k^i(m) &= D_k^i(m) + \min_{j=0}^1(A_{k-1}^i(S_b^j(m))) \\ B_k^i(m) &= \min_{j=0}^1(B_{k+1}^i(S_b^i(m)) + D_{k+1}^j(S_f^j(m))) \\ L(d_k) &= \min_{m=0}^{NS-1} A_k^0(m) + B_k^0(m) - \min_{m=0}^{NS-1} A_k^1(m) + B_k^1(m)\end{aligned}\right\}$$

where $D_k^i(m)$=a BM
   $L_a(d_k)$=extrinsic information obtained from a feed-back loop in the MAP channel decoder;

$x_k$=a systematic code;
$y_k$=a parity code;
i=an expected systematic code;
$Y_l^i(m)$=an expected parity code;
$A_i^k(m)$=a forward state metric (FSM)
$S_b^j(m)$=a backward changed state when an information bit is j to set a current state to m;
$B_k^i(m)$=an RSM;
$S_f^j(m)$=a state changed forward when an information bit is input in a current encode state m; and
$L(d_k)$=a log likelihood ratio (LLR) LLR when an information bit is $d_k$ at time k of MAP.

3. The adaptive MAP channel decoding apparatus of claim 2, wherein the E function operator uses the absolute value of the difference between function input values as a memory address to look-up stored corresponding calculated log function values in a data area of a memory and output the corresponding log function values.

4. The adaptive MAP channel decoding apparatus of claim 1, wherein the controller determines the operation mode according to changes in the accumulated channel noise power and the scaling factor.

5. The adaptive MAP channel decoding apparatus of claim 1, wherein the controller determines the operation mode according to a bit error rate (BER) and a frame error rate (FER) received from the MAP channel decoder.

6. An adaptive MAP channel decoding method in a communication system, comprising the steps of:
    estimating a current channel state;
    performing an E function operation according to the following equation when the current channel state is static and performing a first MAP decoding operation:

$$xEy=\min(x, y)-\log(1+e^{-|x-y|})$$

where x and y are metric values; and
    performing the E function operation according to the following equation when the current channel state is time-varying and performing a second MAP decoding operation:

$$xEy=\min(x, y)$$

where x and y are metric values.

7. The adaptive MAP channel decoding method of claim 6, wherein the second MAP channel decoding operation is performed using the following equations:

$$\begin{aligned}
D_k^i(m) &= (L_a(d_k) + x_k) \cdot i + y_k \cdot Y_1^i(m) \\
A_k^i(m) &= D_k^i(m) + \min_{j=0}^{1}(A_{k-1}^i(S_b^j(m))) \\
B_k^i(m) &= \min_{j=0}^{1}(B_{k+1}^i(S_b^i(m)) + D_{k+1}^j(S_f^j(m))) \\
L(d_k) &= \min_{m=0}^{NS-1} A_k^0(m) + B_k^0(m) - \min_{m=0}^{NS-1} A_k^1(m) + B_k^1(m)
\end{aligned}$$

where $D_k^i(m)$=a BM
    $L_a(d_k)$=extrinsic information obtained from a feed-back loop in the MAP channel decoder;
    $x_k$=a systematic code;
    $y_k$=a parity code;
    i=an expected systematic code;
    $Y_l^i(m)$=an expected parity code;
    $A_i^k(m)$=a forward state metric (FSM)
    $S_b^j(m)$=a backward changed state when an information bit is j to set a current state to m;
    $B_k^i(m)$=an RSM;
    $S_f^j(m)$=a state changed forward when an information bit is input in a current encode state m; and
    $L(d_k)$=an LLR when an information bit is $d_k$ at time k of MAP.

8. The adaptive MAP channel decoding method of claim 6, wherein the current channel state is estimated by checking changes in accumulated channel noise power and a scaling factor.

9. The adaptive MAP channel decoding method of claim 6, wherein the current channel state is estimated by checking changes of accumulated BER and FER.

10. A MAP channel decoding method adaptive to a current communication channel state in a mobile communication system, comprising the steps of:
    performing an E function operation without a log function according to the following equation:

$$xEy=\min(x, y)$$

where x and y are the input of the E function operator; and
    performing a MAP channel decoding according to the following equations:

$$\begin{aligned}
D_k^i(m) &= (L_a(d_k) + x_k) \cdot i + y_k \cdot Y_1^i(m) \\
A_k^i(m) &= D_k^i(m) + \min_{j=0}^{1}(A_{k-1}^i(S_b^j(m))) \\
B_k^i(m) &= \min_{j=0}^{1}(B_{k+1}^i(S_b^i(m)) + D_{k+1}^j(S_f^j(m))) \\
L(d_k) &= \min_{m=0}^{NS-1} A_k^0(m) + B_k^0(m) - \min_{m=0}^{NS-1} A_k^1(m) + B_k^1(m)
\end{aligned}$$

where $D_k^i(m)$=a BM
    $L_a(d_k)$=extrinsic information obtained from a feed-back loop in the MAP channel decoder;
    $x_k$=a systematic code;
    $y_k$=a parity code;
    i=an expected systematic code;
    $Y_l^i(m)$=an expected parity code;
    $A_i^k(m)$=a forward state metric (FSM)
    $S_b^j(m)$=a backward changed state when an information bit is j to set a current state to m;
    $B_k^i(m)$=an RSM;
    $S_f^j(m)$=a state changed forward when an information bit is input in a current encode state m; and
    $L(d_k)$=an LLR when an information bit is $d_k$ at time k of MAP.

11. A receiving device in a communication system, comprising:
    a MAP channel decoder for decoding a signal received in a frame:
    a channel estimator for estimating the channel state of the input signal; and
    a controller for controlling the operation mode of the MAP channel decoder according to the estimated channel state value received from the channel estimator, wherein the channel decoder performs map decoding with a static mode or a time varying mode under the control of the controller.

12. An MAP channel decoding apparatus in a communication system, comprising:
    a receiver receiving a radio signal and outputting a corresponding demodulated signal;
    a MAP channel decoder for decoding the demodulated signal with an E function of following equation:

$$xEy=\min(x, y)$$

where x and y are metric values.

* * * * *